United States Patent
Grisham et al.

(10) Patent No.: US 6,951,114 B2
(45) Date of Patent: Oct. 4, 2005

(54) RELIABLE OUTDOOR INSTRUMENT COOLING SYSTEM

(75) Inventors: John N. Grisham, Houston, TX (US); Michael M. Meadows, Cypress, TX (US); Leslie Wayne Perry, Southington, CT (US); Alan J. Sallwasser, Houston, TX (US)

(73) Assignee: Weatherford/Lamb, Inc., Houston, TX (US)

( * ) Notice: Subject to any disclaimer, the term of this patent is extended or adjusted under 35 U.S.C. 154(b) by 166 days.

(21) Appl. No.: 10/619,936

(22) Filed: Jul. 15, 2003

(65) Prior Publication Data

US 2005/0011199 A1 Jan. 20, 2005

(51) Int. Cl.[7] .................................................. F25B 21/02
(52) U.S. Cl. ........................................ 62/3.7; 62/259.2
(58) Field of Search .............................. 62/3.2, 3.3, 3.6, 62/235.1, 259.2

(56) References Cited

U.S. PATENT DOCUMENTS

| | | | |
|---|---|---|---|
| 3,040,538 A | 6/1962 | Alsing | 62/3 |
| 3,087,309 A | 4/1963 | Toulmin, Jr. | 62/3 |
| 3,232,063 A | 2/1966 | Eichhorn et al. | 62/3 |
| 3,733,836 A | 5/1973 | Corini | 62/3 |
| 4,301,658 A | 11/1981 | Reed | 62/3 |
| 4,328,676 A * | 5/1982 | Reed | 62/3.62 |
| 4,587,563 A * | 5/1986 | Bendell et al. | 348/244 |
| 5,505,046 A * | 4/1996 | Nelson et al. | 62/3.6 |
| 5,890,371 A | 4/1999 | Rajasubramanian et al. | 62/259.2 |
| 6,453,678 B1 * | 9/2002 | Sundhar | 62/3.2 |
| 6,481,213 B2 * | 11/2002 | Carr et al. | 62/3.2 |

OTHER PUBLICATIONS

Electronic Enclosures, EIC Solutions, Inc., May 30, 2003, pp. 1–2.
Peltier Thermoelectric Coolers, Circuit Cellar Online, May 30, 2003, pp. 1–15.

* cited by examiner

Primary Examiner—Melvin Jones
(74) Attorney, Agent, or Firm—Moser, Patterson & Sheridan, L.L.P.

(57) ABSTRACT

A method, system, and apparatus for controlling the temperature within a remotely located enclosure that contains temperature sensitive equipment is provided. For some embodiments, the system includes an array of thermoelectric cooling (TEC) devices that act as an active cooling device and an active heating device. The system may also include a temperature controller that receives signals from a temperature sensor located at or near the temperature sensitive equipment. The controller may be configured to supply DC power to the thermoelectric coupling devices based on the output signal of the temperature sensor. The polarity of the DC power can be reversed by the controller in order to cause the thermoelectric device to heat or to cool the enclosure. The system also contains a passive cooling device. The system includes an independent electrical power source with a battery and solar cell to supply power to the temperature control devices and the equipment contained in the enclosure.

33 Claims, 7 Drawing Sheets

RELIABLE OUTDOOR INSTRUMENT COOLING SYSTEM

BACKGROUND OF THE INVENTION

1. Field of the Invention

The present invention relates to an enclosure for housing electronic equipment and, more particularly, to a temperature-controlled enclosure for housing remotely located temperature sensitive equipment, such as optical signal processing components for monitoring downhole parameters in oil wells.

2. Description of the Related Art

Electronic equipment produces heat when operated and, when the equipment is located in an environment with extreme ambient temperatures, some means of controlling the temperature of the equipment is typically required. Certain electronic equipment, such as opto-electronic components used in optical signal processing are especially sensitive to temperature variation and require an operating temperature in a relatively narrow range in order to function properly. In the oil production industry, such optical signal processing components, located in a control panel at a wellbore surface, are often used in conjunction with downhole fiber optic sensors to measure various downhole parameters.

Often, such control panels are located in remote locations of the earth and subjected to extreme temperatures, which may subject the components to temperatures in excess of their preferred operating temperature range. It is important the maximum operating temperature is not exceeded in order to prevent damage to the component. Further, some components used in measurement systems, especially those that have very low signal to noise ratios (e.g. capacitive based systems), may suffer degradation in accuracy and resolution due to changing ambient temperatures at the front end of their signal conditioning. Such changes in ambient temperatures naturally occur, for example, between day and night. Therefore, controlling both the stability of the temperature and its magnitude are highly desirable.

Heat generated within the panels may be passively removed, but as the ambient (outside) temperature increases, cooling by passive means becomes less effective. Therefore, in order to compensate for extreme heat, devices such as fans and liquid coolers may be used in order to cool sensitive electronic equipment. However, neither approach is satisfactory if the temperature of the device must be below the outside air temperature. Therefore, in such cases, a device which can produce temperatures below the surrounding air temperature, such as a compressor based refrigerator, is required.

However, cooling systems utilizing refrigerators and fans contain many moving parts and are, therefore, subject to mechanical failure. For example, refrigerating compressor components are subject to mechanical failure and typically require frequent maintenance, However, remotely located control panels are generally required to operate essentially unattended for long periods of time and frequent maintenance is inconvenient and expensive, particularly if production operations are interrupted. Additionally, cooling systems using refrigerators require substantial power to drive the compressor and typically require a reliable external source of electrical power (e.g., line AC service), which is often not available in remote locations.

Accordingly, a need exists for a temperature controlled electrical enclosure that can operate in a remote environment with minimal maintenance, and, preferably, without an external source of reliable electrical power.

SUMMARY OF THE INVENTION

The present invention relates to an apparatus for and method of controlling the temperature of an electrical enclosure in a remote location.

One embodiment provides an apparatus for regulating temperature of one or more temperature-sensitive components within a main enclosure. The apparatus generally includes a self-contained power supply, one or more thermoelectric coolers, a temperature sensor for measuring temperature within a temperature-controlled zone at or near the temperature-sensitive components, and a temperature controller configured to regulate power supplied from the independent power supply to the thermoelectric coolers to maintain the temperature within the temperature-controlled zone within a specified range.

Another embodiment provides apparatus for maintaining a temperature of one or more temperature-sensitive components within a main enclosure. The apparatus generally includes one or more solid state cooling devices, a thermally conductive manifold positioned to conduct heat from the temperature-sensitive components to the solid state cooling devices, a temperature sensor for measuring temperature at or near the one or more temperature-sensitive components, and a temperature controller configured to generate a signal to the solid state cooling devices to maintain the temperature at or near the temperature-sensitive components within a specified range.

Another embodiment provides a fiber optic sensing system. The fiber optic sensing system generally includes one or more fiber optic sensors for sensing one or more downhole parameters, one or more optical signal processing components optically coupled to the one or more fiber optic sensors via one or more optical fibers, and a temperature controlled enclosure housing the one or more optical signal processing components, one or more thermoelectric coolers thermally coupled with at least one of the optical signal processing components, a temperature sensor for measuring temperature at or near the optical signal processing components, and a temperature controller configured to vary power supplied to the thermoelectric coolers based on a signal from the temperature sensor.

Yet another embodiment prvides a method of regulating temperature of one or more temperature-sensitive components within an enclosure. The method generally includes thermally coupling the temperature-sensitive components to one or more thermoelectric coolers, measuring temperature at or near the temperature-sensitive components, and varying power supplied to thermoelectric coolers thermally coupled with at least one of the temperature-sensitive components, in response to the measured temperature.

DETAILED DESCRIPTION OF THE PREFERRED EMBODIMENT

The present invention generally provides methods, apparatus and systems for controlling the temperature in an enclosure suitable for housing temperature sensitive components. For some embodiments, cooling systems of the present invention may utilize thermoelectric cooling (TEC) devices. TEC devices are particularly appropriate for this application because they contain no moving parts and require little maintenance relative to compressor based refrigerators and cooling systems utilizing fans. For some embodiments, the cooling systems may also include a self contained power source operable in remote locations of the earth (e.g., locations without reliable electrical power).

Embodiments of the present invention may be utilized to an advantage to maintain the operating temperature of virtually any type temperature-sensitive equipment, such as analog electronic components, high speed digital electronics, components with very low signal to noise ratios or any other type of components. However, to facilitate understanding, embodiments of the present invention may be described below with reference to maintaining the operating temperature of temperature sensitive optoelectronic components as a particular, but not limiting, application example. Accordingly, it should be understood that the following techniques described with reference to opto-electronic components may also be applied to other types of temperature-sensitive components, as well.

An Exemplary Application Environment

Figure 1:
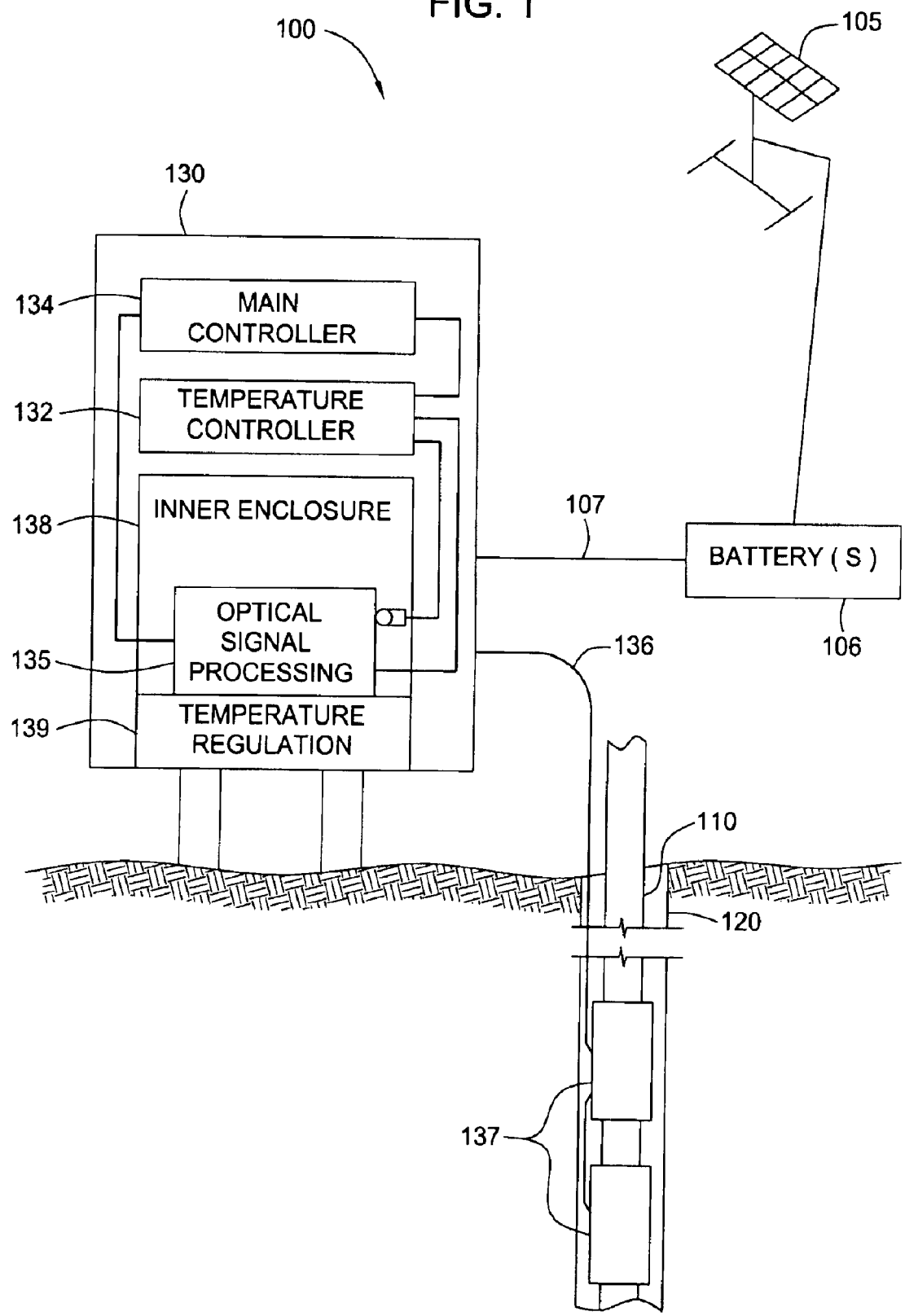
FIG. 1 illustrates an exemplary application environment in which embodiments of the present invention may be utilized.

FIG. 1 illustrates an exemplary fiber optic sensing system 100 having a temperature controlled enclosure 130, according to one embodiment of the present invention. As illustrated, the enclosure 130 may house optical signal processing components 135 in communication, via at least one connecting line 136, with one or more fiber optic sensors 137 deployed as part of a string of production tubing (pipe) 110 within a wellbore 120. The fiber optic sensors 137 may include any combination of well known fiber optic sensors, for example, utilizing fiber Bragg grating (FBGs), interferometers, and/or distributed temperature sensing (DTS), to sense any combination of a wide variety of downhole parameters, such as temperature, pressure, flow, vibration, density, and the like.

The optical signal processing components 135 may include any suitable combination of optical, electronic, and/or opto-electronic components suitable for interrogating the fiber optic sensors 137, such as a light source, optical components for receiving light reflected from the fiber optic sensors 137, and opto-electronic components for converting the reflected light into electrical signals provided to a main controller 134. For some embodiments, one or more the optical signal processing components 135 may be thermally coupled directly to the active temperature regulating components 139. For other embodiments, one or more of the optical signal processing components 135 may be thermally coupled with the active temperature regulating components 139 via a thermally conductive inner enclosure 138 housing the optical signal processing components 135. The inner enclosure 138 may act as a manifold conducting heat away from the optical signal processing components 135 to the temperature regulating components 139.

The inner enclosure 138 may define a temperature-controlled zone, the temperature in which is maintained by the temperature regulating components 139, in conjunction with a temperature controller 132. For example, the temperature controller 132 may generate a control signal, based on a temperature sensor (not shown) thermally coupled with the optical signal processing components 135 and/or located within the inner enclosure 138, to vary an amount of cooling or heating by the temperature regulating components 139 in order to maintain the temperature in the inner enclosure 138 within a predefined range. The predefined range may vary with different embodiments, and will generally be chosen to ensure accurate operation of the optical signal processing components 135. In other words, the predefined range will typically fall within a specified operating range of the optical signal processing components 135 (or any other type equipment contained within the inner enclosure 138).

While the inner enclosure 138 generally provides the highest level of temperature control within the main enclosure 130, the remaining components (e.g., main controller 134 and temperature controller 132) also receive the benefit of cooling or heating from the exterior walls of the inner enclosure 138.

As shown in FIG. 1, for some embodiments, such as embodiments used in remote, offshore or difficult to reach locations, a solar panel 105 (or array of solar panels) supplies electrical power to a bank of one or more battery(s) 106 which in turn supplies electrical power to the enclosure 130 via a cable 107, thus enabling operation of the control panel 130 in such locations without reliable electrical service. The solar panel 105 may also be strategically placed to provide shade to the enclosure 130, which may further assist in its cooling. In other embodiments, the solar panel 105 and/or battery(s) 106 may be replaced, or supplemented, with another power source such as a generator, fuel cell, wind machine or other electrical energy-producing device. In some embodiments, line AC power may be used to operate the apparatus if such power is available.

Figure 2:
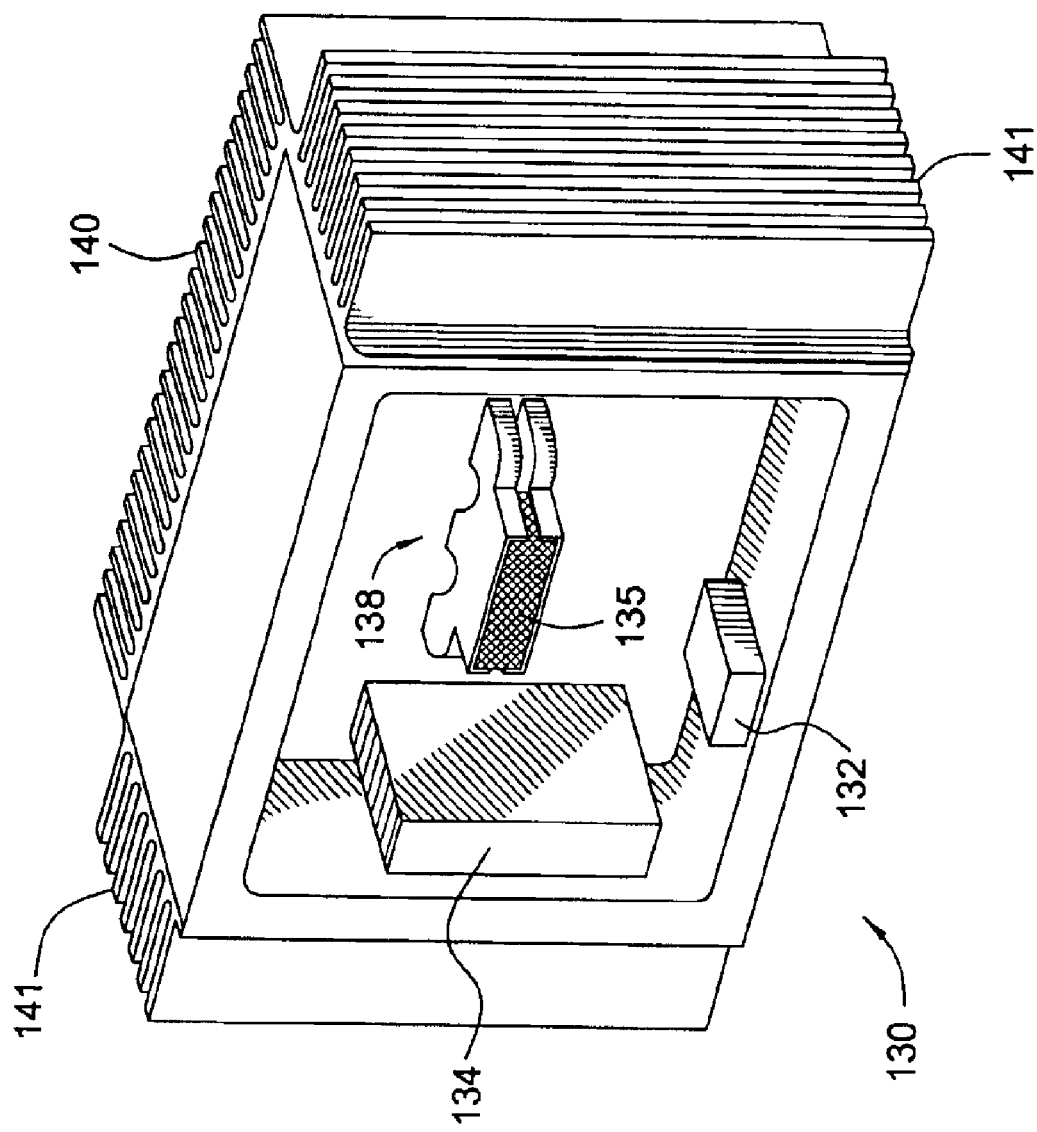
FIG. 2 is a perspective view of an enclosure, according to one embodiment of the present invention.

FIG. 2 shows an exterior view of one embodiment of the enclosure 130 with a cut-away section exposing the internal enclosure 138. As illustrated, because the enclosure 130 may be deployed in remote locations, operating unattended and exposed to the elements, the enclosure 130 may be sealed from the elements (e.g., hermetically sealed). Sealing of the enclosure 130 may exacerbate the problems of heating due to heat generating components, such as the optical signal processing components 135, as there is no convective path for the heated air to escape. Therefore, as illustrated, the inner enclosure 138 may be thermally coupled to heat exchangers (e.g., one or more finned heat sinks 140) located on the exterior of the enclosure 130. Additionally, due to the sealed nature of the enclosure, a desiccant material may be included to prevent condensation of the moisture contained in the air trapped inside the enclosure 130.

FIG. 2 shows the arrangement of the heat sinks 140 and 141 present in the preferred embodiment, but any of the heat sinks may be located on any of the exterior walls of the enclosure as required by the components inside the enclosure 130.

Relational View of the Temperature-controlled Enclosure

Figure 3:
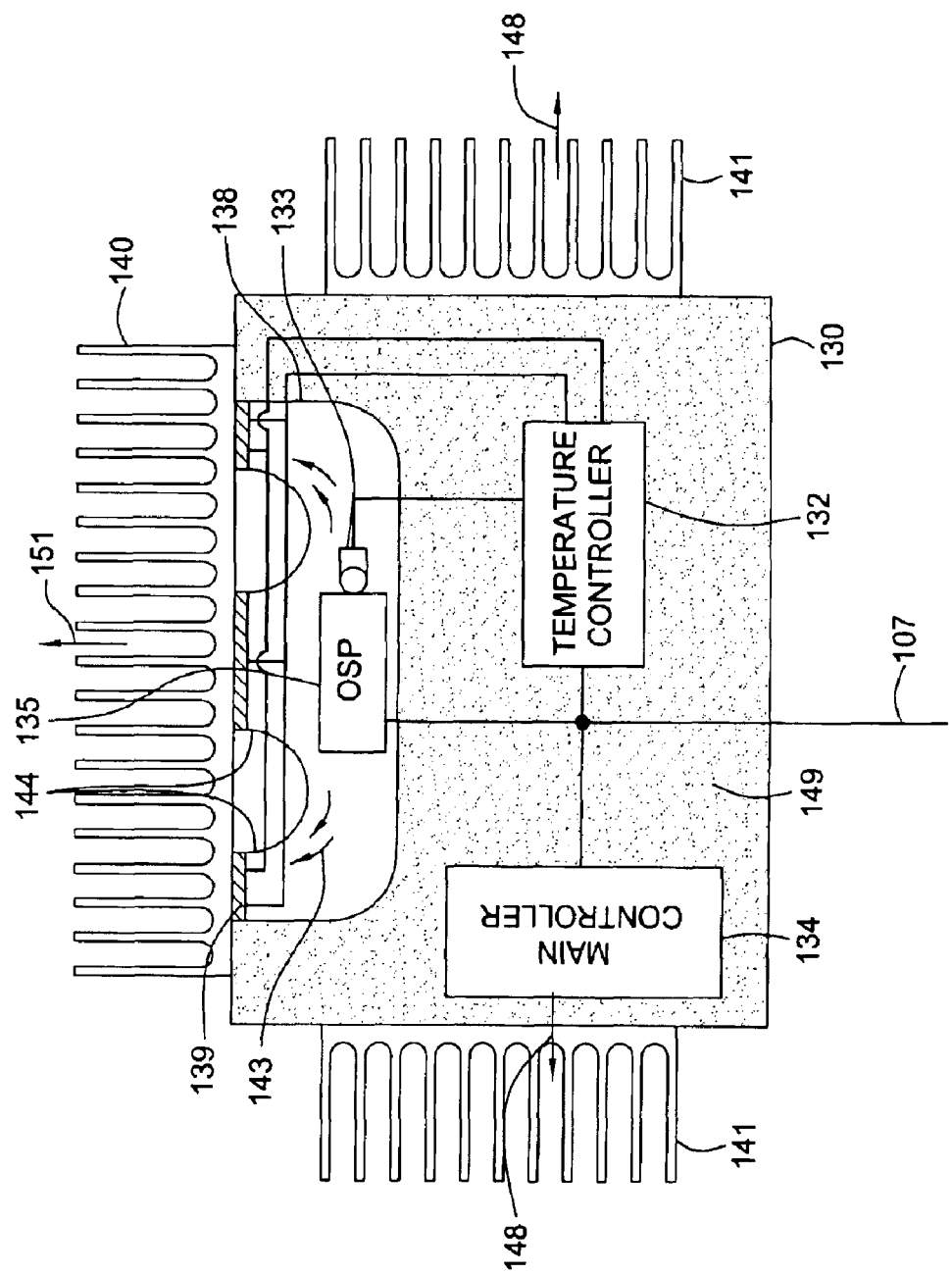
FIG. 3 is a relational top view of an enclosure, according to one embodiment of the present invention.

As illustrated by the arrows 143 in the relational view of the enclosure 130, shown in FIG. 3, heat generated by the optical signal processing components 135 may be conducted to the finned heat sink 140, via the inner enclosure 138 and the active temperature regulating components 139 as shown by arrow 151. In other words, the inner enclosure 138 may be made of a thermally conductive material (e.g., metal) and may have an inner surface shaped to thermally couple to the optical signal processing components 135. As illustrated, the inner enclosure 138 may also include protrusions 144 having a surface shaped for thermally coupling with the active temperature regulating components 139.

As previously described, the temperature controller 132 may be configured to control the active temperature regulating components 139 via one or more control signals generated based on a signal received from a temperature sensor 133. The temperature sensor 133 may be generally positioned to monitor the temperature of the optical signal processing components 135 or, more generally, the temperature within the inner enclosure 138. The temperature controller 132 may be implemented using any suitable components, such as a dedicated "off the shelf" temperature controller, a specially configured embedded controller, programmable logic controller (PLC), or any other suitable type controller. Further, while shown as separate components, for some embodiments, the main controller 134 may be configured to perform the temperature controlling algorithms described herein, eliminating the need for a separate temperature controller.

The temperature controller 132 may be configured to implement any suitable known or to be developed control algorithm (e.g., using the signal from the temperature sensor 133 as feedback), such as simple On/Off control, proportional (P) control, proportional-derivative (P-D) control, or proportional-integral-derivative (P-I-D) control, to generate a signal suitable for controlling the active temperature regulating devices 139. The control signal generated may be any type suitable to control the type of active temperature regulating devices 139 chosen for a given application. Examples of suitable control signals include voltage signals, current signals, and frequency signals.

For some embodiments, the active temperature regulating components 139 may include thermoelectric cooling TEC devices, and the control signal may be a modulated DC signal. For some embodiments, cooling and/or heating with the TEC devices may be controlled by varying the duty cycle of a pulse-width-modulated (PWM) DC signal, in order to vary the DC power supplied. TEC devices operate on the Peltier principle: as direct current (DC) passes through a junction of two dissimilar metals, one metal evolves heat, while the other absorbs heat. As shown, the TEC devices may be disposed between the inner enclosure 138 and the finned heat sink 140 (e.g., with a different one of the dissimilar metals thermally coupled to each). Thus, by regulating the DC power supplied, the TEC devices may be configured, in effect, as a heat pump, drawing heat from the inner enclosure 138 to the finned heat sink 140. This effect is reversed when the direction of the DC current is reversed (e.g., the polarity of the DC signal is reversed), which may result in delivery of heat to the optical signal processing components 135.

Thus, the TEC devices 139 may provide a convenient means for both heating and cooling, as required. It should be noted that the TEC devices 139 are, generally more efficient at heating and, therefore, less power is typically required for heating purposes. Conveniently, while more power is generally required for cooling with the TEC devices 139, there is also generally more sunlight at times when cooling is necessary. The solar panels 105 are generally designed to be able to maintain sufficient charge on the bank of batteries 106 powering the panel in expected lighting conditions throughout the year.

For some embodiments, the inner enclosure 138 may be shaped in order to enhance the ratio of heat transfer via conduction vs. heat transfer to the interior of enclosure 130 via convection. The inner enclosure 138 is heat conductive and is in contact either directly or via thermal grease 142 or other known or to be developed thermal interface material with one or more TEC device 139 or other active cooling or heating devices known or to be developed. Particularly, the inner enclosure 138 may have protrusions 144 with a contact surface shaped substantially similarly to the contact area of the thermoelectric cooler(s) 139.

Figure 4:
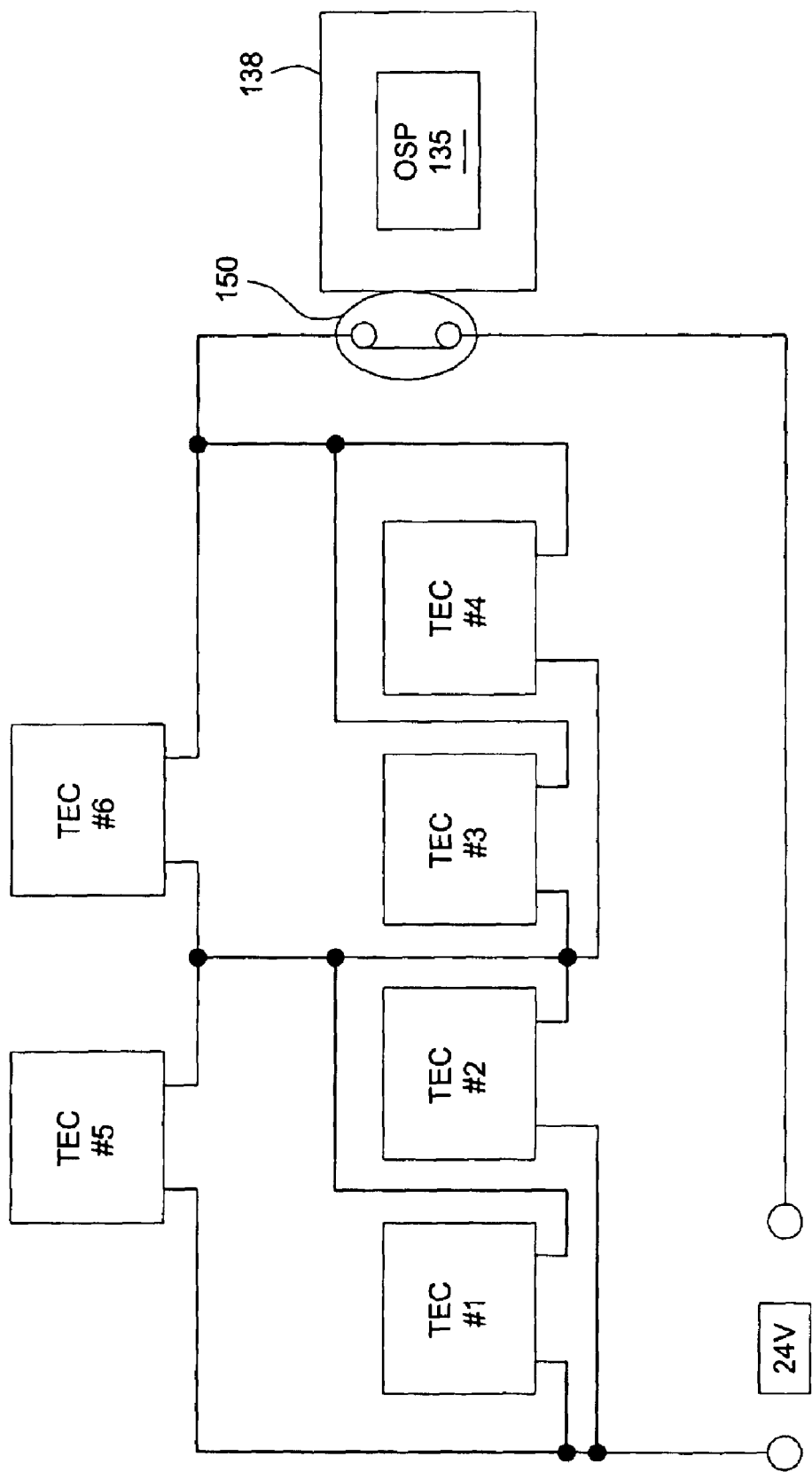
FIG. 4 is a diagram of an exemplary array of thermoelectric cooling (TEC) devices, according to one embodiment of the present invention.

As illustrated in FIG. 4, the TEC devices 139 may be arranged as an array in contact with the heat sinks 140 mounted on a wall of the enclosure 130. The positions of the TEC devices 139 in contact with the heat sink 140 may be optimized to minimize the concentration of heat (hot spots) in the heat exchanger 140 in order to maximize overall heat transfer. In other words, the TEC devices 139 may be located to evenly distribute (spread) heat among fins of the heat sink 140 to maximize the transfer of heat to the surrounding ambient air.

The TEC devices 139 may be connected electrically in any suitable arrangements. As shown, for some embodiments, sets of parallel-connected TECs may be connected in series. The exact electrical configuration is a design decision and may be based on several factors, such as the exact type and size of TECs used, available power, the required amount of heating and/or cooling, the required accuracy (e.g., how broad a temperature range must be maintained), and the like. These and other factors may be considered by a designer to arrive at an optimal physical and electrical arrangement of TEC devices 139.

In some cases, failure of the temperature sensor 133 and/or temperature controller 132 may have catastrophic results, for example, causing the TECs to heat rather than cool, which may cause permanent component damage. Further, it may also be possible for the TEC devices 139 to become decoupled from the inner enclosure 138 and/or heat sink 140, in which case, the conductive path from the optical signal processing components 135 to the outside may be broken, preventing the TEC devices 139 from efficiently cooling. As the temperature rises (e.g., as indicated by the temperature sensor 133), the temperature controller 132 may then continue to increase power to the TEC devices 139, which may eventually damage the TEC devices 139. Therefore, for some embodiments, a thermal switch 150 may be utilized to monitor temperature within the inner enclosure 138, or otherwise within the main enclosure 130. For example, the main controller 134 may be configured to detect the opening of the thermal switch 150 and take appropriate responsive action (e.g., disconnect power to the optical signal processing components, disregard readings, alert service personnel, etc.).

Referring back to FIG. 3, other heat sinks 141 may be positioned in close proximity to other heat generating components inside the enclosure 130, such as the main controller 134. This allows heat transfer, as shown by arrow 148, to the environment in localized high temperature areas while preventing heat transfer from outside the enclosure 130 to the inside of the enclosure in areas that have a temperature lower than the outside air temperature. Additionally, insulation 149 may be disposed within the enclosure 130, for example, in an effort to reduce the amount of unwanted heat transfer between the environment and the enclosure.

Figure 5:
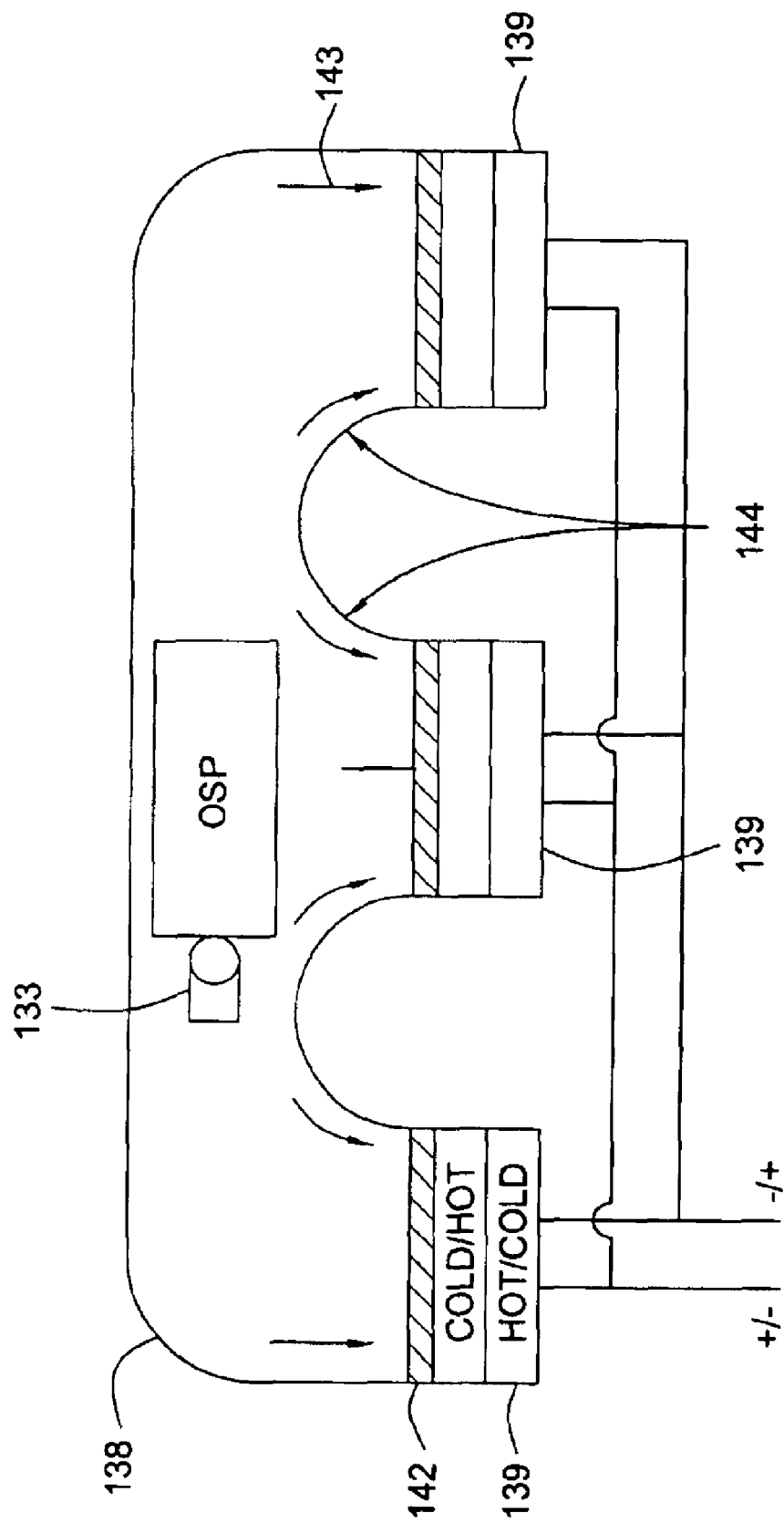
FIG. 5 is a detailed relational view of a temperature-controlled inner enclosure and attached TECs, according to one embodiment of the present invention.

As shown in FIG. 5, for some embodiments, a contact surface of protrusions 144 of the inner enclosure 138 may be shaped to mate with a surface of the TEC devices 139. To enhance thermal conductivity (i.e., reduce thermal resistance) a thermal interface material (TIM) 142, such as a thermal grease, thermal adhesive, or thermal epoxy, may be disposed between the protrusions 144 and the TEC devices 139. Similarly, while not shown in the figures, a TIM may also be disposed between the TEC devices 139 and the heat sink 141.

Figure 6:
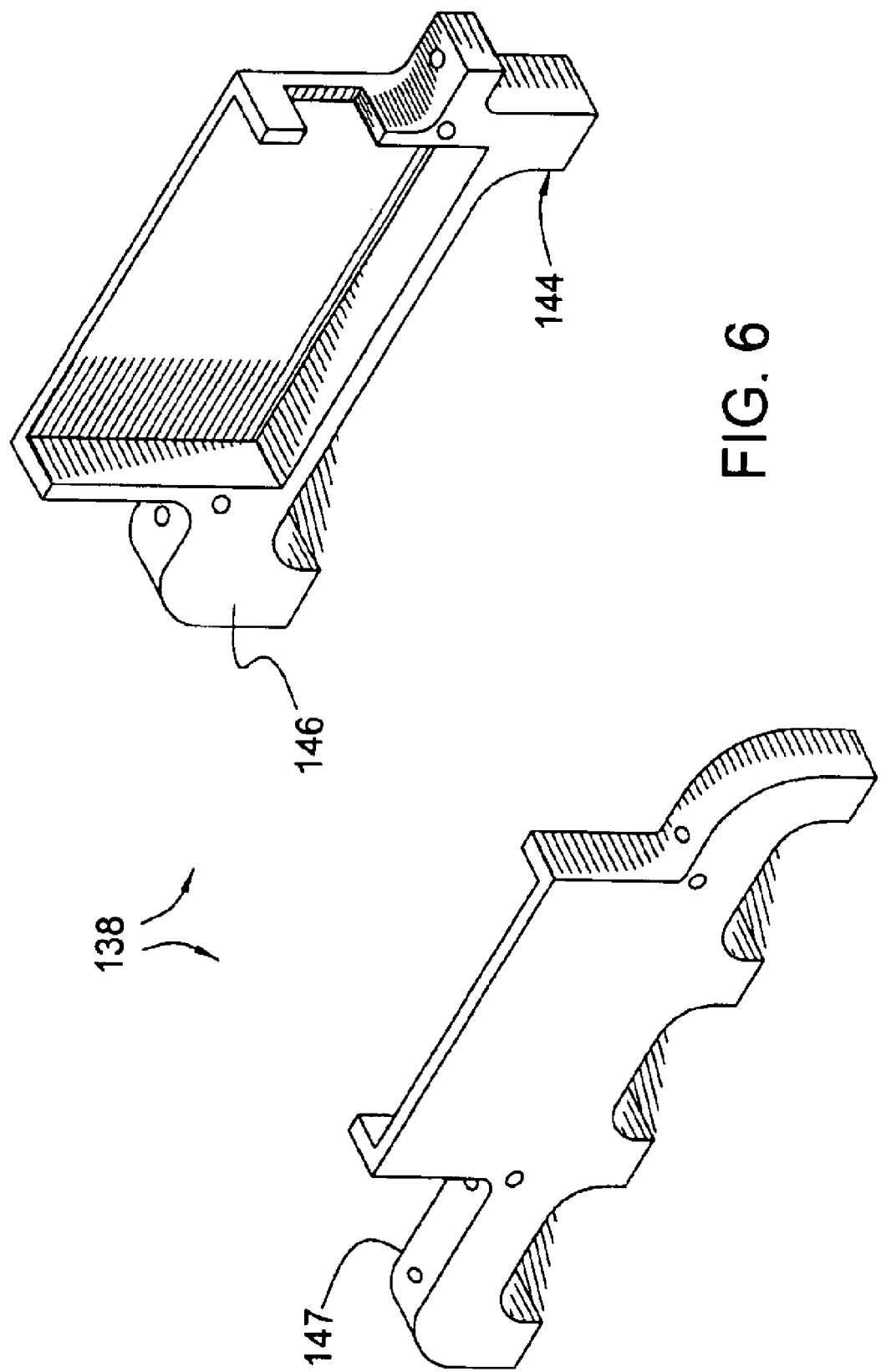
FIG. 6 is a perspective view of one embodiment of the inner enclosure of FIG. 5.

FIG. 6 shows the inner enclosure 138 split into its component parts. The surfaces 146 and 147 may or may not mate as is permitted by the size and shape of the temperature sensitive component located in the temperature controlled zone. In other words, for some embodiments, rather than fully enclose the optical signal processing components 135, the inner enclosure 138 may merely contact the optical signal processing components 135. In either case, as previously described, the inner enclosure 138 acts as a manifold, of sorts, conducting heat from the optical signal processing components 135 to the TEC devices 139.

Figure 7:
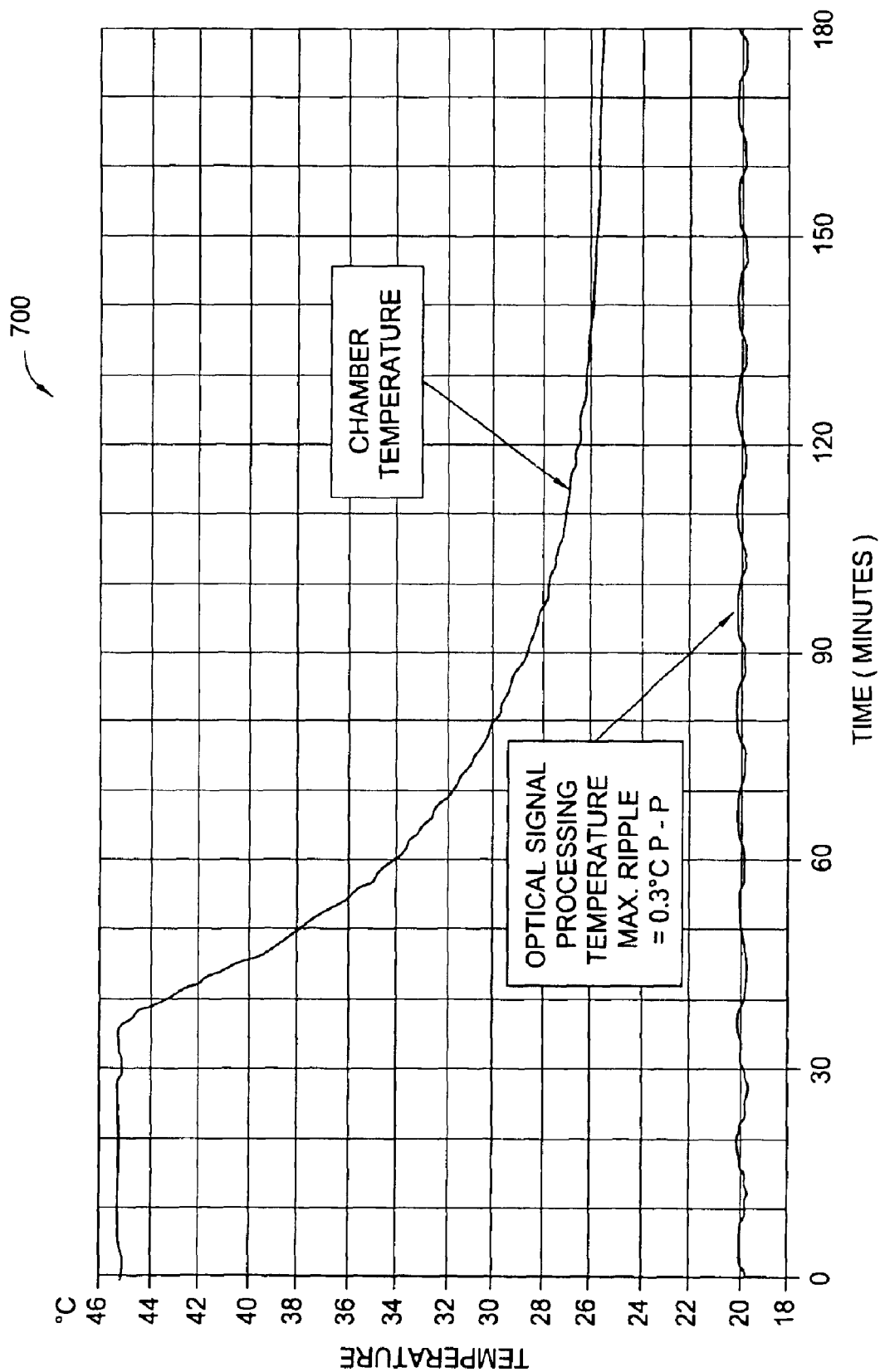
FIG. 7 illustrates the maintained temperature within the inner enclosure that may be achieved by one embodiment of the present invention.

FIG. 7 contains graph 700, a chart of temperature within the temperature controlled inner enclosure 138 versus temperature within an environmental test chamber (i.e., an oven), showing the effectiveness of the temperature control that can be achieved with one embodiment of the present invention. As shown, while the chamber temperature is varied from approximately 46° C. (115° F.) to approximately 26° C. (79° F.), the temperature within the inner enclosure 138 may be maintained within 0.3° C. of a target temperature (as shown, approximately 20° C.). An even tighter range may be achieved, for example, by optimizing control parameters (e.g., P-I-D parameters) of temperature controller 132.

Typically, a range of 0.5° C. will be sufficient for optoelectronic components. It will be appreciated that, for some embodiments, wider (or otherwise different) temperature ranges may be predefined depending on the requirements of the particular components housed in the inner enclosure 138 (e.g., digital electronic components may be able to operate within a wider temperature range than optical signal processing components 135).

Further, the temperature range may be centered around a higher or lower target temperature, for example, in an effort to reduce power consumption. As an example, maintaining a target temperature of 30° C. may require less power for cooling than maintaining a target temperature of 20° C., due to the smaller difference from the outside temperature. Additionally, a target temperature may be selected above the anticipated dew point of the ambient air in order to prevent condensation of humidity in the air inside the enclosure 130.

Conclusion

By maintaining the temperature of one or more temperature-sensitive components within an enclosure, embodiments of the present invention may improve the accuracy of measurements made using such components. By utilizing a combination of conduction via active solid state cooling devices and passive convection (e.g., via heat sinks), operating temperatures may be maintained within a specified range without moving parts, which may reduce the frequency of associated maintenance. Further, the reliability of some components may degrade over time, as a function of ambient temperature. Thus, by maintaining such components (or subsystems containing them) at cooler temperatures, the reliability and longevity of a whole system may be improved.

While the foregoing is directed to embodiments of the present invention, other and further embodiments of the invention may be devised without departing from the basic scope thereof, and the scope thereof is determined by the claims that follow.

What is claimed is:

1. An apparatus for regulating temperature of one or more temperature-sensitive components within a main enclosure, comprising:
    a self-contained power supply;
    one or more thermoelectric coolers;
    a temperature sensor for measuring temperature within a temperature-controlled zone at or near the temperature-sensitive components;
    an inner enclosure within the main enclosure, the inner enclosure made of a thermally conductive material that is thermally coupled to the thermoelectric coolers; and
    a temperature controller configured to regulate power supplied from the independent power supply to the thermoelectric coolers to maintain the temperature within the temperature-controlled zone within a specified range by conduction between the thermoelectric coolers and the inner enclosure.

2. The apparatus of claim 1, wherein the self-contained power supply comprises one or more batteries.

3. The apparatus of claim 2, wherein the apparatus further comprises one or more solar cells adapted to charge the one or more batteries.

4. The apparatus of claim 1, wherein the temperature controlled zone is defined by the inner enclosure.

5. The apparatus of claim 1, further comprising one or more heat exchangers thermally coupled with the thermoelectric coolers.

6. The apparatus of claim 5, wherein the inner enclosure is thermally coupled to the one or more heat exchangers via the thermoelectric coolers.

7. The apparatus of claim 6, wherein contact surfaces of the inner enclosure thermally coupled with the thermoelectric coolers are spaced to minimize regions of high temperature in the heat exchangers.

8. The apparatus of claim 6, wherein the temperature-sensitive components are thermally coupled to the inner enclosure with a thermal interface material.

9. The apparatus of claim 1, further comprising an insulative material disposed within the main enclosure.

10. The apparatus of claim 5, wherein the heat exchangers are attached to exterior walls of the main enclosure.

11. The apparatus of claim 1, wherein the temperature controller is configured to regulate power supplied from the independent power supply to the at least one thermoelectric cooler by varying a duty cycle of a pulse width modulated signal.

12. The apparatus of claim 1, wherein the temperature controller is configured to:
    supply the thermoelectric coolers with a voltage signal having a first polarity to cool the temperature-sensitive components; and
    supply the thermoelectric coolers with a voltage signal having a second polarity, opposite the first polarity, to heat the temperature-sensitive components.

13. The apparatus of claim 1, further comprising a thermal switch responsive to a temperature within the temperature controlled zone, wherein power is removed from the at least one thermal electric cooler in response to the thermal switch changing states.

14. The apparatus of claim 1, wherein the controller is configured to maintain the temperature of the temperature-sensitive components at or above an anticipated dewpoint for a geographic area in which the apparatus is deployed or is to be deployed.

15. An apparatus for regulating temperature of one or more temperature-sensitive components within a main enclosure, comprising:
   a self-contained power supply;
   one or more thermoelectric coolers;
   a temperature sensor for measuring temperature within a temperature-controlled zone at or near the temperature-sensitive components; and
   a temperature controller configured to regulate power supplied from the independent power supply to the thermoelectric coolers to maintain the temperature within the temperature-controlled zone within a specified range, wherein the apparatus is capable of maintaining a temperature within the temperature controlled zone within a range of approximately 0.3 degrees Celsius peak to peak within a predefined target temperature.

16. An apparatus for maintaining a temperature of one or more temperature-sensitive components within a main enclosure, comprising:
   one or more solid state cooling devices;
   a thermally conductive manifold that is thermally coupled to the one or more solid state cooling devices to conduct heat from the temperature-sensitive components to the solid state cooling devices;
   a temperature sensor for measuring temperature at or near the one or more temperature-sensitive components; and
   a temperature controller configured to generate a signal to the solid state cooling devices to maintain the temperature at or near the temperature-sensitive components within a specified range.

17. The apparatus of claim 16, wherein the manifold is thermally coupled to one or more heat exchangers on the exterior of the main enclosure, via the one or more solid state cooling devices.

18. The apparatus of claim 16, wherein the manifold is shaped to minimize convective transfer of heat from the manifold to the interior of the main enclosure.

19. The apparatus of claim 18, wherein the manifold comprises one or more protrusions, each having a contact surface shaped to mate with one of the solid state cooling devices, wherein the protrusions are configured to evenly distribute heat among fins of the heat exchangers.

20. A fiber optic sensing system, comprising:
   one or more fiber optic sensors for sensing one or more downhole parameters;
   one or more optical signal processing components optically coupled to the one or more fiber optic sensors via one or more optical fibers; and
   a temperature controlled enclosure housing the one or more optical signal processing components, one or more thermoelectric coolers thermally coupled via at least one thermally conductive manifold with at least one of the optical signal processing components, a temperature sensor for measuring temperature at or near the optical signal processing components, and a temperature controller configured to vary power supplied to the thermoelectric coolers based on a signal from the temperature sensor.

21. The system of claim 20, wherein the temperature controller is configured to vary power supplied to the thermoelectric coolers by varying a duty cycle of a pulse width modulated signal.

22. The system of claim 20, wherein the temperature controller is configured to supply the thermoelectric coolers with a voltage signal of a first polarity to cool the temperature-sensitive components and a voltage signal of a second polarity, opposite the first polarity, to heat the temperature-sensitive components.

23. The system of claim 20, further comprising one or more heat exchangers disposed on an exterior of the enclosure and thermally coupled to the thermoelectric coolers.

24. The system of claim 23, wherein the thermoelectric coolers are spaced to evenly distribute heat across fins of the heat exchangers.

25. The system of claim 24, wherein the at least one thermally conductive manifold comprises a plurality of protrusions, each having a contact surface for mating with a corresponding thermoelectric cooler.

26. The system of claim 20, further comprising a thermal interface material disposed between the optical signal processing components and the thermally conductive manifolds.

27. The system of claim 20, further comprising:
   a bank of one or more batteries for supplying power to components within the enclosure; and
   an array of one or more solar panels for maintaining a charge on the bank of one or more batteries.

28. The system of claim 27, wherein the array of one or more solar panels is positioned to shade the enclosure.

29. A method of regulating temperature of one or more temperature-sensitive components within an enclosure, comprising the steps of:
   thermally coupling the temperature-sensitive components to one or more thermoelectric coolers via at least one thermally conductive manifold;
   measuring temperature at or near the temperature-sensitive components; and
   varying power supplied to thermoelectric coolers thermally coupled with at least one of the temperature-sensitive components, in response to the measured temperature.

30. The method of claim 29, further comprising thermally coupling the thermoelectric coolers to one or more heat exchangers disposed on an exterior of the enclosure.

31. The method of claim 29, wherein varying power supplied to thermoelectric coolers in response to the measured temperature comprises performing a proportional-integral-differential control algorithm, using the measured temperature as feedback.

32. The method of claim 31, wherein varying power supplied to thermoelectric coolers comprises varying a duty cycle of a pulse width modulated signal.

33. The method of claim 29, wherein varying power supplied to thermoelectric coolers in response to the measured temperature comprises:
   applying a voltage signal of a first polarity to the thermoelectric coolers to cool the temperature sensitive components; and
   applying a voltage signal of a second polarity to the thermoelectric coolers to heat the temperature-sensitive components, wherein the second polarity is opposite the first polarity.

* * * * *